US010820419B2

(12) United States Patent
Seo et al.

(10) Patent No.: US 10,820,419 B2
(45) Date of Patent: Oct. 27, 2020

(54) MEMORY SYSTEM AND STORAGE DEVICE INCLUDING PRINTED CIRCUIT BOARD WHERE CHANNEL GROUPS HAVE BOTH POINT TO POINT TOPOLOGY AND DAISY CHAIN TOPOLOGY

(71) Applicant: Samsung Electronics Co., Ltd., Suwon-si, Gyeonggi-do (KR)

(72) Inventors: Byung-guk Seo, Hwaseong-si (KR); Sun-ki Yun, Yongin-si (KR); Su-jin Kim, Hwaseong-si (KR); Hwi-jong Yoo, Seoul (KR); Young-rok Oh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/207,339

(22) Filed: Dec. 3, 2018

(65) Prior Publication Data
US 2019/0373730 A1 Dec. 5, 2019

(30) Foreign Application Priority Data

May 30, 2018 (KR) ........................ 10-2018-0062132

(51) Int. Cl.
*H05K 1/18* (2006.01)
*H05K 1/11* (2006.01)
(Continued)

(52) U.S. Cl.
CPC ............... *H05K 1/181* (2013.01); *G11C 5/04* (2013.01); *H05K 1/115* (2013.01); *G11C 16/10* (2013.01); *G11C 16/26* (2013.01); *H05K 2201/10159* (2013.01); *H05K 2201/10545* (2013.01); *H05K 2201/10734* (2013.01)

(58) Field of Classification Search
CPC ................... H05K 1/181; H05K 1/115; H05K 2201/10545; H05K 2201/10734; H05K 2201/10159; G11C 5/04; G11C 16/10; G11C 16/26
See application file for complete search history.

(56) References Cited

U.S. PATENT DOCUMENTS 7,102,905 B2   9/2006 Funaba et al.
7,113,418 B2   9/2006 Oberlin et al.
(Continued)

FOREIGN PATENT DOCUMENTS

JP         3896112 B2    3/2007
JP         4205553 B2    1/2009
JP      2014-212215 A   11/2014

*Primary Examiner* — Sultana Begum
(74) *Attorney, Agent, or Firm* — Harness, Dickey & Pierce, P.L.C.

(57) ABSTRACT

A memory system includes a printed circuit board, at least one memory chip mounted on the printed circuit board, and a memory controller arranged on the printed circuit board and connected to $2^N$ (where N is an integer of 2 or more) channels, the memory controller configured to perform a write operation and a read operation on the at least one memory chip. In the printed circuit board, a first subset of the channels corresponds to a first channel group configured in a point to point topology, and a remaining subset of the channels corresponds to a second channel group configured in a daisy chain topology.

19 Claims, 15 Drawing Sheets

(51) Int. Cl.
    *G11C 5/04*         (2006.01)
    *G11C 16/10*      (2006.01)
    *G11C 16/26*      (2006.01)

(56) References Cited

U.S. PATENT DOCUMENTS

| | | |
|---|---|---|
| 7,385,281 B2 | 6/2008 | Nishio et al. |
| 8,407,395 B2 | 3/2013 | Kim et al. |
| 8,539,152 B2 | 9/2013 | Shaeffer et al. |
| 8,604,351 B2 | 12/2013 | Zhou et al. |
| 9,496,016 B2 | 11/2016 | Lee et al. |
| 9,748,953 B2 | 8/2017 | Lee et al. |
| 2006/0132577 A1 | 6/2006 | Hsu et al. |
| 2008/0082750 A1* | 4/2008 | Okin ........................ G11C 5/04 711/115 |
| 2010/0165562 A1* | 7/2010 | Segaram ................. G06F 1/185 361/679.31 |
| 2010/0188972 A1* | 7/2010 | Knapp .................... H04L 12/43 370/226 |
| 2011/0026232 A1* | 2/2011 | Lin .................. H01L 21/76898 361/760 |
| 2013/0235542 A1* | 9/2013 | Song ...................... H01P 1/047 361/773 |
| 2014/0312488 A1 | 10/2014 | Fukuda |
| 2015/0043298 A1 | 2/2015 | Hayashi et al. |
| 2017/0336909 A1* | 11/2017 | Song ..................... G06F 3/0416 |

\* cited by examiner

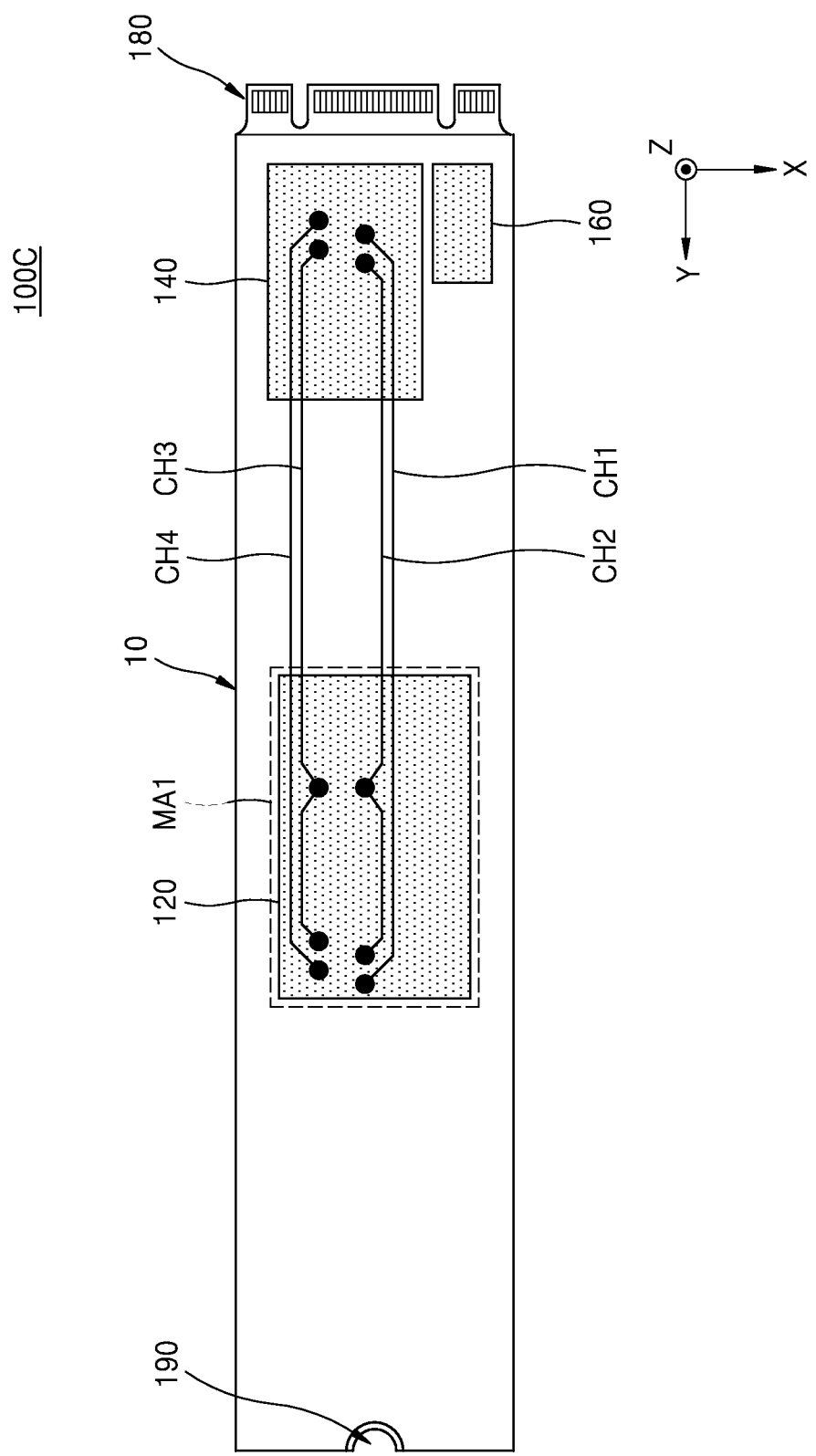

MEMORY SYSTEM AND STORAGE DEVICE INCLUDING PRINTED CIRCUIT BOARD WHERE CHANNEL GROUPS HAVE BOTH POINT TO POINT TOPOLOGY AND DAISY CHAIN TOPOLOGY

CROSS-REFERENCE TO RELATED APPLICATION

This application claims the benefit of Korean Patent Application No. 10-2018-0062132, filed on May 30, 2018, in the Korean Intellectual Property Office, the disclosure of which is incorporated herein in its entirety by reference.

BACKGROUND

Inventive concepts relate to a memory system and/or a storage device, and more particularly, to a printed circuit board included in a memory system, the memory system including the printed circuit board, and/or a storage device including the printed circuit board.

Storage devices are used to store data and may be classified into volatile memory storage devices and nonvolatile memory storage devices. For example, flash memory storage devices, which are nonvolatile memory storage devices, are widely used in cellular phones, digital cameras, personal digital assistants (PDAs), mobile computers, stationary computers, servers, and other devices.

SUMMARY

Some inventive concepts provide a printed circuit board capable of being included in both a low capacity memory system and a high capacity memory system by using a form factor which configures a portion of channels performing a write operation and a read operation in a point to point manner/topology and the other portion of the channels in a daisy chain manner/topology.

Some inventive concepts provides a memory system and a storage device including the printed circuit board.

The problems to be solved by inventive concepts are not limited to the above-mentioned problems, and other matters not mentioned may be clearly understood by those of ordinary skill in the art from the following description.

According to some example embodiments of inventive concepts, there is provided a memory system comprising a printed circuit board, at least one memory chip mounted on the printed circuit board, and a memory controller arranged on the printed circuit board and connected to $2^N$ (where N is an integer of 2 or more) channels, the memory controller configured to perform a write operation and a read operation on the at least one memory chip. In the printed circuit board, a first subset of the channels corresponds to a first channel group configured in a point to point topology, and a remaining subset of the channels corresponds to a second channel group configured in a daisy chain topology.

According to some example embodiments of inventive concepts, there is provided a printed circuit board comprising a first wiring unit inside a substrate in a point to point topology, a second wiring unit inside the substrate in a daisy chain topology, a memory controller area on a surface of the substrate, and at least two memory chip mounting areas arranged on the surface of the substrate. A first portion of the at least two memory chip mounting areas corresponds to a first mounting area where all of the first and second wiring units extend from the memory controller area, and a remaining portion of the at least two memory chip mounting areas corresponds to a second mounting area where the second wiring unit extends from the memory controller area.

According to some example embodiments of inventive concepts, there is provided a storage device comprising a printed circuit board, at least one semiconductor package mounted on the printed circuit board and including a plurality of nonvolatile memory chips, and a memory controller arranged on the printed circuit board and connected to $2^N$ (where N is an integer of 2 or more) channels, the memory controller configured to perform write and read operations on the at least one semiconductor package. The printed circuit board comprises an insulating layer, a first wiring unit and a second wiring unit, the first wiring unit and the second wiring unit comprising conductive traces formed on the insulating layer, and conductive vias configured to pass through the insulating layer and connected to the conductive traces. A first half of the channels is configured as a first wiring unit in a point to point topology, and a remaining other half of the channels is configured as a second wiring unit in a daisy chain topology.

BRIEF DESCRIPTION OF THE DRAWINGS

Embodiments of inventive concepts will be more clearly understood from the following detailed description taken in conjunction with the accompanying drawings in which:

FIGS. 7A and 7B are a plan view and a cross-sectional view illustrating a memory system according to some example embodiments, respectively;

DETAILED DESCRIPTION OF EXAMPLE EMBODIMENTS

Hereinafter, embodiments of inventive concepts will be described in detail with reference to the accompanying drawings.

Figure 1:
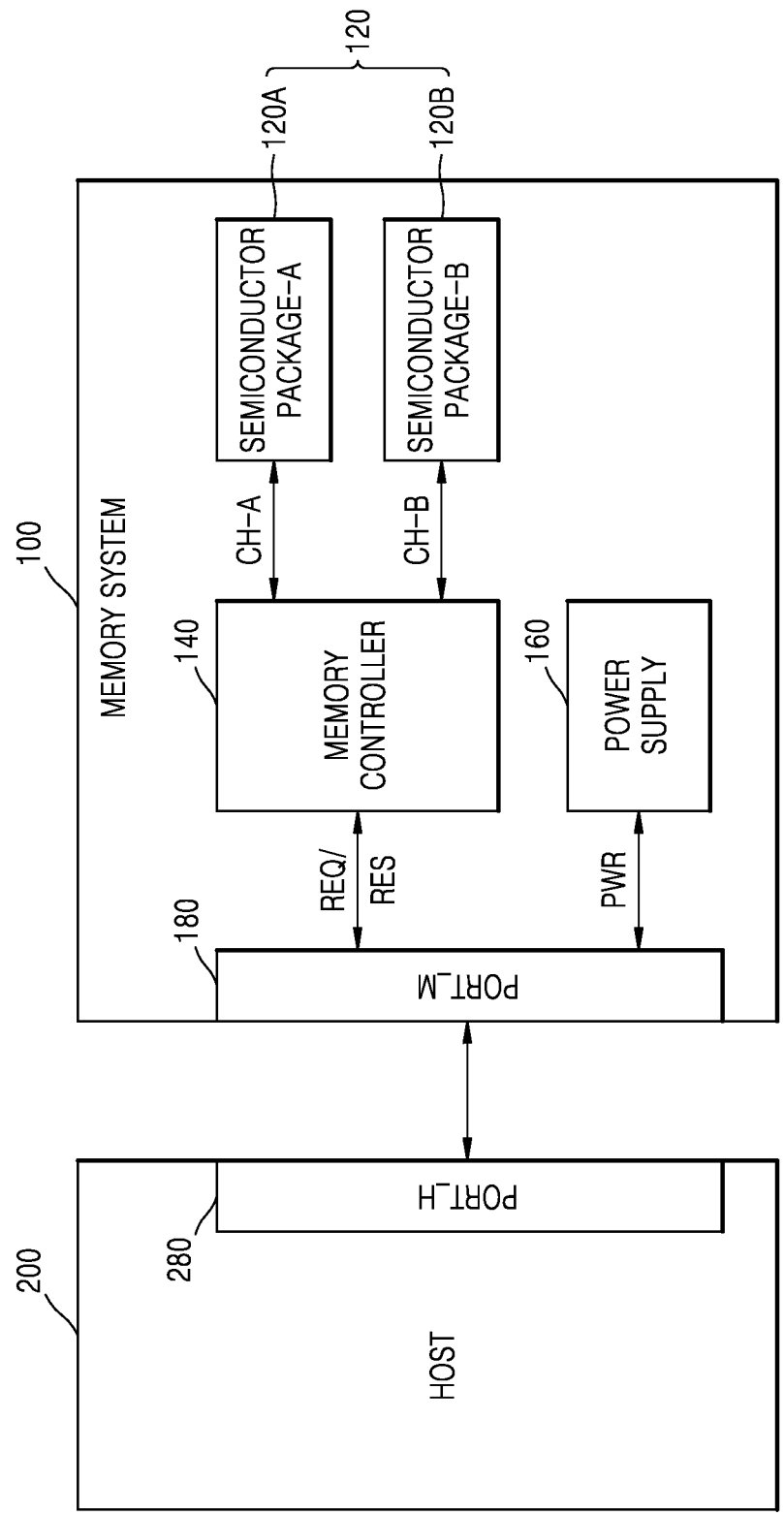
FIG. 1 is a block diagram illustrating a memory system according to some example embodiments.

FIG. 1 is a block diagram illustrating a memory system 100 according to some example embodiments.

Referring to FIG. 1, the memory system 100 and a host 200 may communicate with each other, and the memory system 100 may include a first semiconductor package 120, a memory controller 140, a power supply 160, and a port 180.

The first semiconductor package 120 may include a plurality of memory chips each including a plurality of memory cells. The first semiconductor package 120 may also include the case in which the memory chip is of a chip scale type, not of a package type, and may not refer to only a general semiconductor package type. As semiconductor package process technology develops, the memory chip may be mounted on a printed circuit board of the chip scale type instead of the package type. In addition, the memory chip may be protected, e.g. completely protected, by a case or the like, or the memory chip may be encapsulated on, e.g. directly on the printed circuit board by using polymer resin rather than a molding compound.

In some example embodiments, the memory chip may be or include a memory chip including a three-dimensional (3D) memory array. The 3D memory array may be monolithically formed on at least one physical level of the memory cells which include an active area arranged on a silicon substrate and a circuit formed on or in the substrate as a circuit related with an operation of the memory cells. The term "monolithic" may refer to a state in which layers of each level included in a memory cell array are stacked directly on top of each of lower layers, which are under the layers of each level, among the memory cell arrays.

In some example embodiments, the 3D memory array may include NAND strings arranged in a vertical structure in which at least one memory cell is arranged above other memory cells, and auxiliary cells are arranged above or under the memory cells, and the at least one memory cell may include a charge trap layer.

In some example embodiments, the plurality of memory cells may be planar NAND flash memory cells in a two-dimensional horizontal structure. In some example embodiments, the plurality of memory cells may be nonvolatile memory cells such as resistive random access memory (RAM) (RRAM), phase change RAM (PRAM), and magnetic RAM (MRAM).

A memory cell included in the memory cell array may store data of 2 bits or more. In some example embodiments, the memory cell included in the memory cell array may be a multi level cell (MLC) that stores 2-bit data. In some example embodiments, the memory cell included in the memory cell array may be a triple level cell (TLC) that stores 3-bit data. In some example embodiments, the memory cell included in the memory cell array may store data of four bits or more. In addition, the memory cell included in a string of the memory cell array may be used as a single level cell (SLC) that stores 1-bit data.

The memory chip included in the first semiconductor package 120 may be connected to the memory controller 140 through a channel group. For example, a semiconductor package-A 120A may be connected to the memory controller 140 through a channel group-A CH-A and a semiconductor package-B 120B may be connected to the memory controller 140 through channel group-B CH-B. Although two semiconductor packages, the semiconductor package-A 120A and the semiconductor package-B 120B, and two channel groups, the channel group-A CH-A and the channel group-B CH-B, are illustrated in FIG. 1, the memory system 100 according to inventive concepts may include one semiconductor package and one channel group, or may include three or more of semiconductor packages and channel groups.

The memory controller 140 may receive a request REQ from the host 200 through the ports 180 and 280 and send a response RES to the host 200 through the ports 180 and 280. For example, the memory controller 140 may receive the request REQ for reading data from the host 200 through the ports 180 and 280, and in response to the received request REQ, the memory controller 140 may read data stored in the memory chip included in the first semiconductor package 120 and transmit the read data to the host 200 through the ports 180 and 280. The memory controller 140 may be configured in the semiconductor package type or the chip scale type.

The power supply 160 may receive power PWR from the host 200 through the ports 180 and 280 and may provide the power PWR to components included in the memory system 100 such as the first semiconductor package 120 and the memory controller 140 based on the received power PWR.

The ports 180 and 280 may include a plurality of pins and the number, a size, and an arrangement of the pins may be determined based on an interface protocol for communication with the host 200. The memory system 100 and the host 200 may communicate with each other through at least one of various interface protocols, for example, universal serial bus (USB), multimedia card (MMC), peripheral component interconnect (PCI) express (PCI-E), advanced technology attachment (ATA), serial-ATA, parallel-ATA, small computer system interface (SCSI), enhanced small disk interface (ESDI), integrated drive electronics, or the like, and the ports 180 and 280 may include the plurality of pins according to the interface protocol.

According to inventive concepts, the memory system 100 may support a form factor for mounting the first semiconductor package 120 which has various storage capacities. The memory system 100 may include a wiring substrate such as the printed circuit board (PCB), and components of the memory system 100 such as the first semiconductor package 120, the memory controller 140, and the power supply 160 may be mounted on the PCB. The PCB may include memory chip mounting areas that are apart from each other, and the memory system 100 may be flexibly used by adjusting memory capacities such that the first semiconductor package 120 is mounted in all of the memory chip mounting areas or the first semiconductor package 120 is mounted in only one of the memory chip mounting areas according to an environment and/or an application in which the memory system 100 is used.

In addition, there may be a higher a production efficiency of the memory system 100, which includes the PCB having one form factor that supports various memory capacities, compared with an individual production of memory systems which include the PCB having a plurality of form factors.

Figure 2:
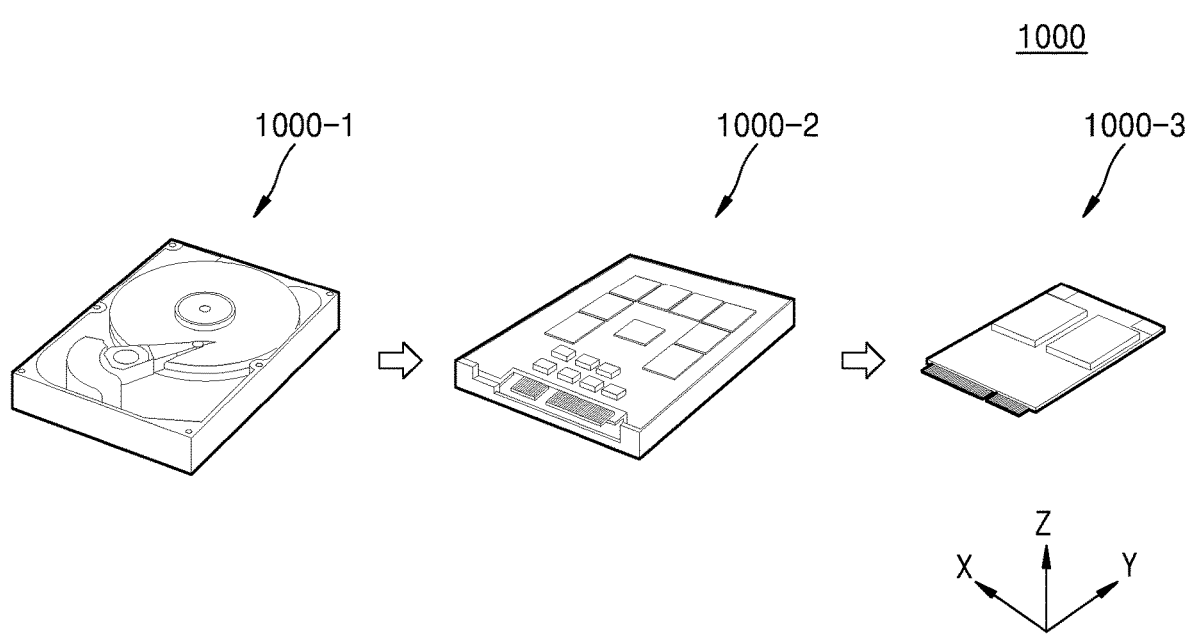
FIG. 2 is a diagram illustrating examples of a storage device that includes a memory system.

FIG. 2 is a diagram illustrating examples of a storage device 1000 including the memory system 100.

As semiconductor process technology advances, instead of general devices, storage devices including semiconductor memory chips, such as magnetic disks, magnetic tapes, and/or optical disks, are being used for storing data. Storage devices including semiconductor memory chips may provide results such as low power consumption, a small size, and/or high storage capacity, and the results may be further enhanced as semiconductor process technology advances.

Referring to FIG. 2, a hard disk drive (HDD) 1000-1 as some example embodiments of the storage device 1000 may include a platter which stores data on a magnetic body coated on a surface thereof. The platter may be rotated by a spindle motor, and data may be written or read by an input/output head. In this manner, the HDD 1000-1 may require a relatively large size due to components such as a motor for rotating the platter and the input/output head for writing data into the platter. For example, the HDD 1000-1 may have a form factor of about 5.25 inches, about 3.5 inches, about 2.5 inches, about 1.8 inches, etc.

As semiconductor process technology advances, a solid state drive (SSD) 1000-2 as some example embodiments of the storage device 1000 may include the semiconductor memory chip. For example, the semiconductor memory chip may include a flash memory as a nonvolatile memory and store data into memory cells included in the flash memory. The SSD 1000-2 may accept the form factor of the HDD 1000-1 for compatibility with the HDD 1000-1, and may support an interface protocol of the HDD 1000-1.

As a size of an electronic device including a memory system (for example, memory system 100 of FIG. 1) and a host (for example, 200 of FIG. 1) decreases and the memory system 100 operating at a high speed is required and/or pursued, the memory system 100, which supports a high speed interface protocol while having a size smaller than a general size, has been required. Accordingly, the form factor corresponding to a relatively small size, for example, a mini (m) serial advanced technology attachment (SATA) (mSATA) standard using a PCI-E mini card layout and an M.2 standard specifying sizes more flexibly than the mSATA standard, has been proposed. These standards may specify a small size SSD 1000-3 as illustrated in FIG. 2, and the small size SSD 1000-3 may include at least one semiconductor package mounted on a PCB (refer to 120 in FIG. 1). One form factor may include a thickness of the storage device 1000 (that is, a length in a Z direction) and widths in the left and the right (that is, lengths in X and Y directions).

Hereinafter, the memory system 100 and the storage device 1000 are described as including the PCB and at least one first semiconductor package 120 mounted on the PCB, such as the small size SSD 1000-3.

Figure 3A:
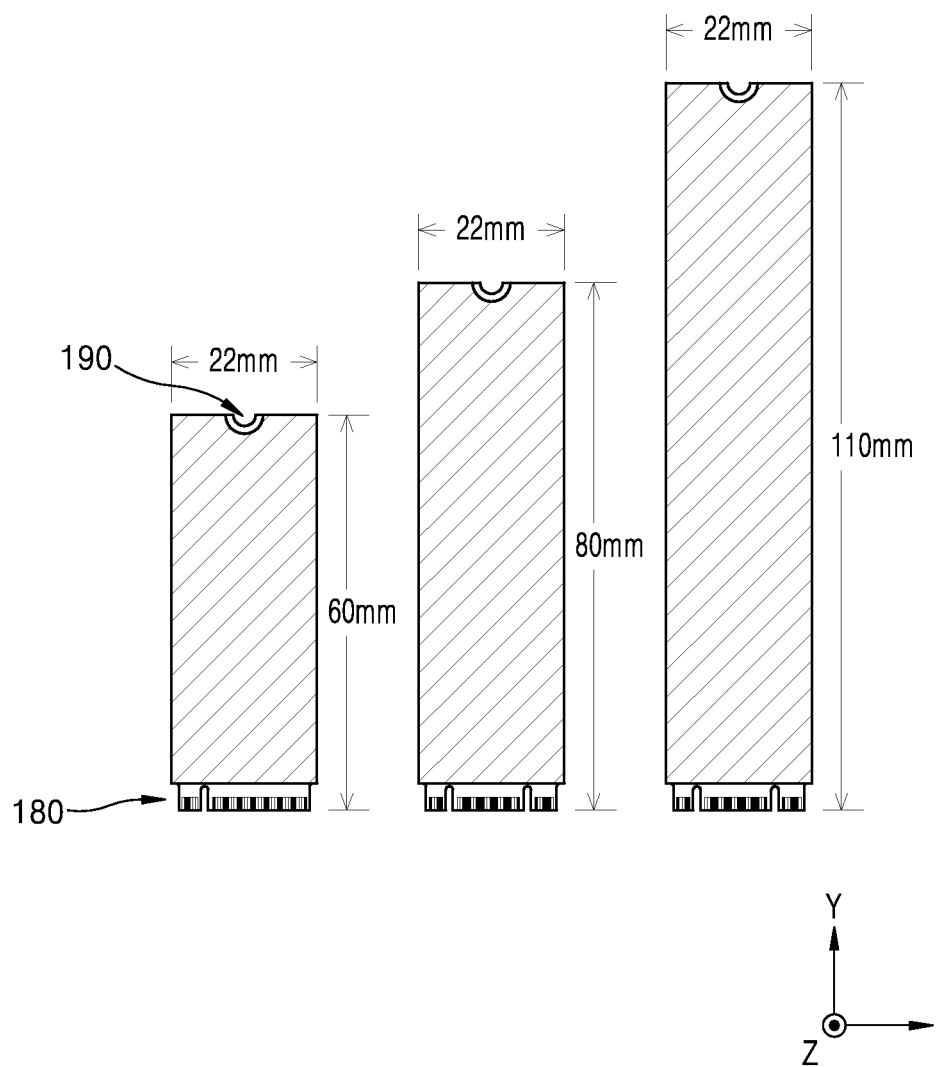
FIGS. 3A and 3B are diagrams illustrating examples of a form factor that defines a printed circuit board on which a memory system is mounted.
Figure 3B:
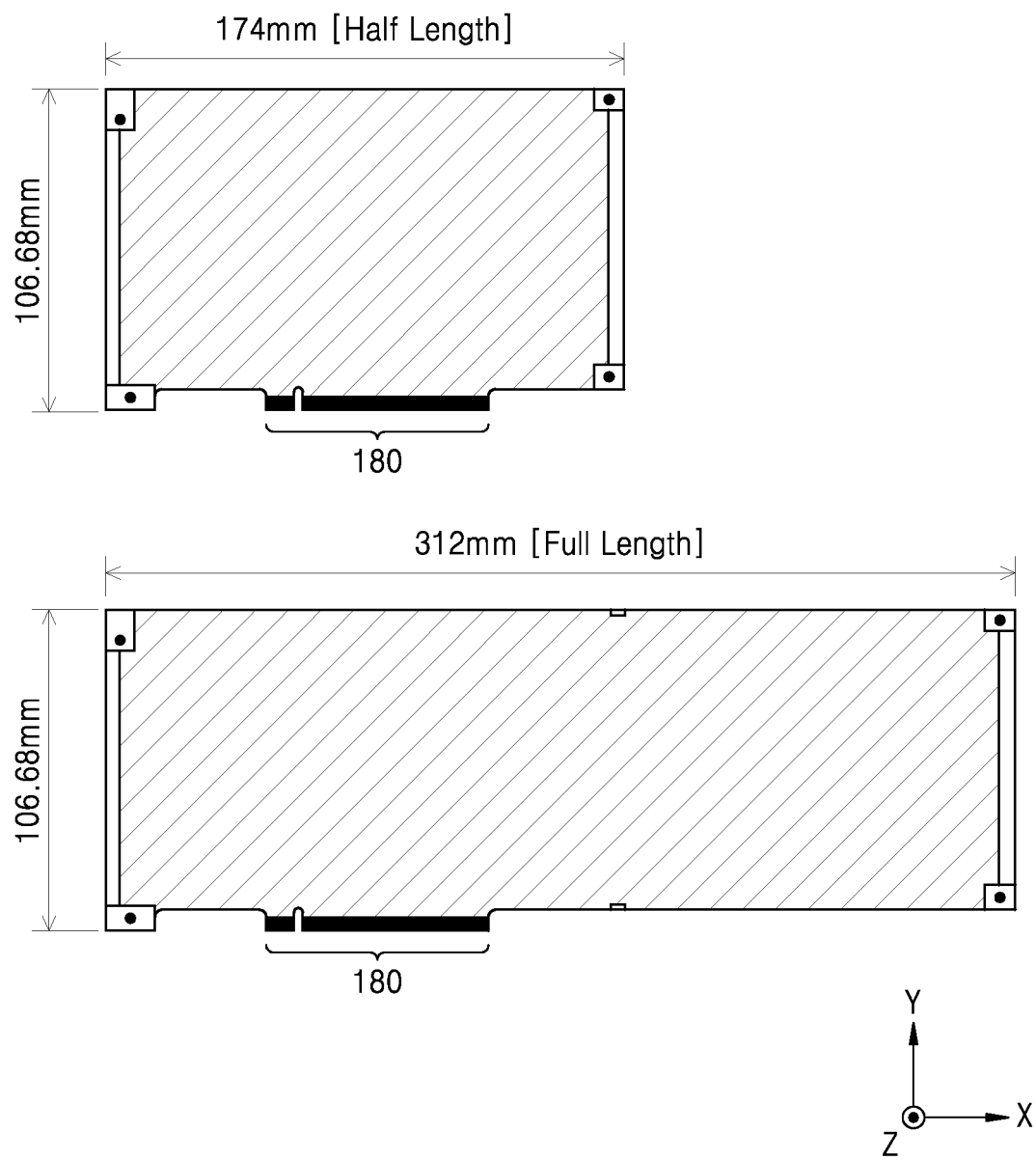

FIGS. 3A and 3B are diagrams illustrating examples of the form factor that defines the PCB on which the memory system 100 is mounted.

FIG. 3A illustrates various sizes of a PCB 10-1 according to the M.2 standard and FIG. 3B illustrates various sizes of a PCB 10-2 according to the PCI card standard.

Referring to FIG. 3A, examples of the form factor are illustrated, and the M.2 standard may specify the thickness and the left/right widths of the PCB 10-1 included in a storage device (refer to 1000 of FIG. 2). The M.2 standard may specify the length in the X direction of the PCB 10-1 as about 22 mm and specify the length in the Y direction of the PCB 10-1 as about 60 mm, about 80 mm, or about 110 mm.

The M.2 standard may specify the port 180. The port 180 may be arranged on one side of the PCB 10-1 and may include the plurality of pins for communicating with a host (refer to 200 in FIG. 1). The plurality of pins may have an exposed pattern, and the exposed pattern may be connected to a socket included in the host 200. The plurality of pins may include a conductive material, for example, a metal such as copper.

In addition, the M.2 standard may specify an indented structure 190 for mounting and fixing a memory system (refer to 100 in FIG. 1) onto a host (refer to 200 in FIG. 1). The form factor may include the semicircular indented structure 190 formed on an opposite side of the port 180. The exposed pattern may be formed on a rim of the indented structure 190 and when mounted on the host 200, may be connected to an electric conductor of the host 200. For example, the pattern formed on the rim of the indented structure 190 may correspond to a ground node of the memory system 100 and when mounted on the host 200, may be connected to the electric conductor corresponding to the ground node of the host 200.

Referring to FIG. 3B, the PCI card standard, as the example of the form factor, may correspond to the length in the X direction of the PCB 10-2 included in a storage device (refer to 1000 in FIG. 2) as about 174 mm or about 312 mm, and the length in the Y direction of the PCB 10-2 as about 106.68 mm.

The length in the X direction specified by the PCI card standard may correspond to a length, e.g. the maximum length of the PCB 10-2, and the length in the X direction of about 174 mm may be referred to as a half length and the length in the X direction of about 312 mm may be referred to as a full length. For example, the PCB 10-2 of the half length may have the length in the Y direction of about 106.68 mm and the length in the X direction of about 174 mm or less. In both the half length and the full length, the port 180 may have the same location and shape.

The PCBs 10-1 and 10-2 may be fabricated to have various form factors to accommodate different specifications of various main boards included in various electronic apparatuses, the number of mounted semiconductor packages according to memory capacity, etc. When the PCB is fabricated by using one form factor regardless of the number of mounted semiconductor packages according to the memory capacity, production efficiency may be enhanced.

Thus, a PCB (refer to 10 of FIG. 4A) according to inventive concepts may support both a low capacity memory system and a high capacity memory system with one form factor by configuring a portion of the channels performing write and read operations in a point to point manner/topology and configuring the other portion of the channels in a daisy chain manner/topology, and accordingly, may provide a high production efficiency.

Hereinafter, the PCB 10 according to embodiments of inventive concepts are described to comply with the form factors according to the M.2 standard, but inventive concepts are not limited thereto. In addition, FIGS. 3A and 3B illustrate examples of form factors of the PCBs 10-1 and 10-2, in which the M.2 standard and the PCI standard are proposed, respectively. However, it may be understood that inventive concepts are applicable to other standards which specify the form factors corresponding to a plurality of sizes of the PCB.

Figure 4A:
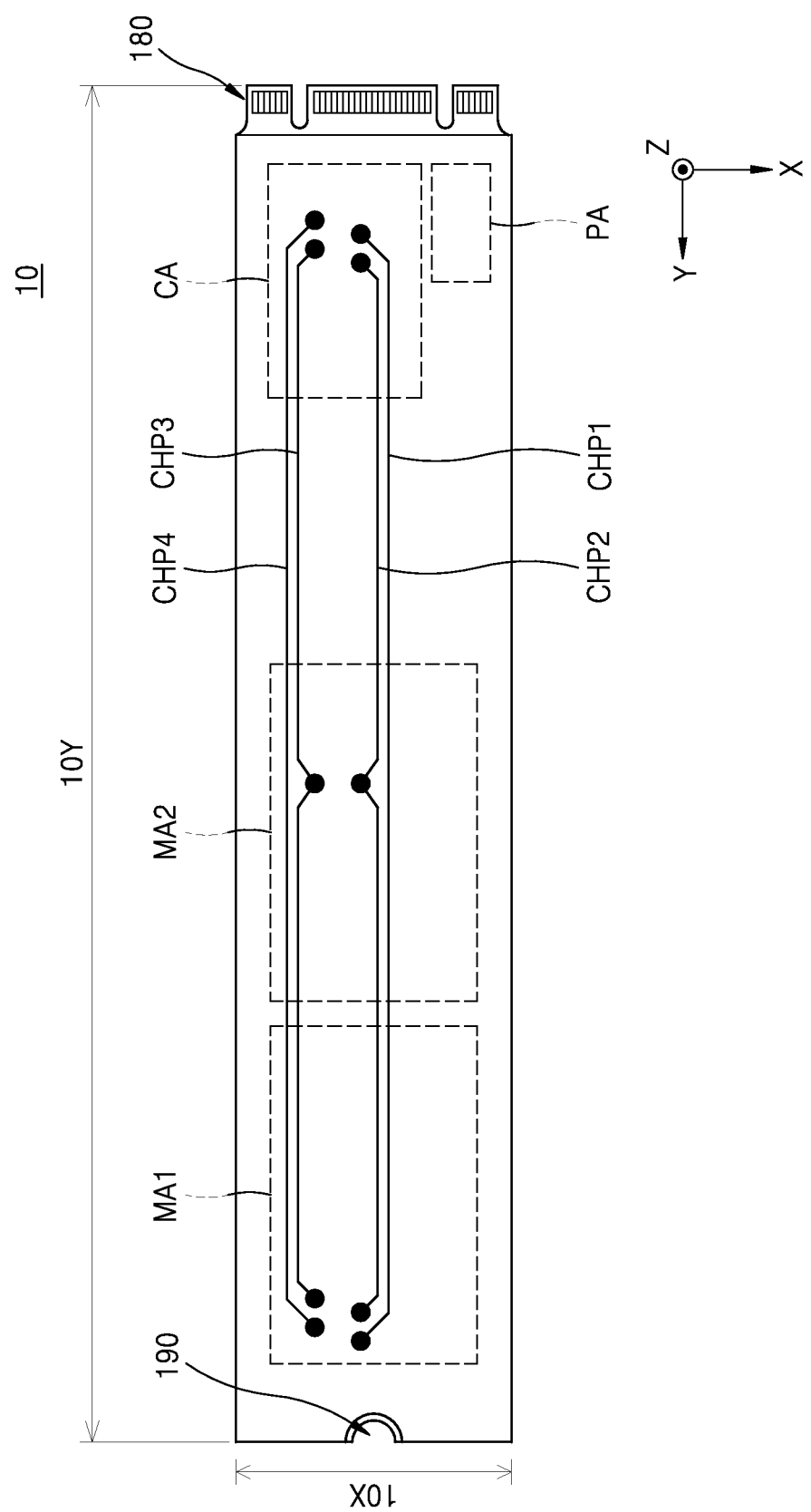
FIGS. 4A and 4B are a plan view and a cross-sectional view illustrating a printed circuit board according to some example embodiments, respectively.
Figure 4B:
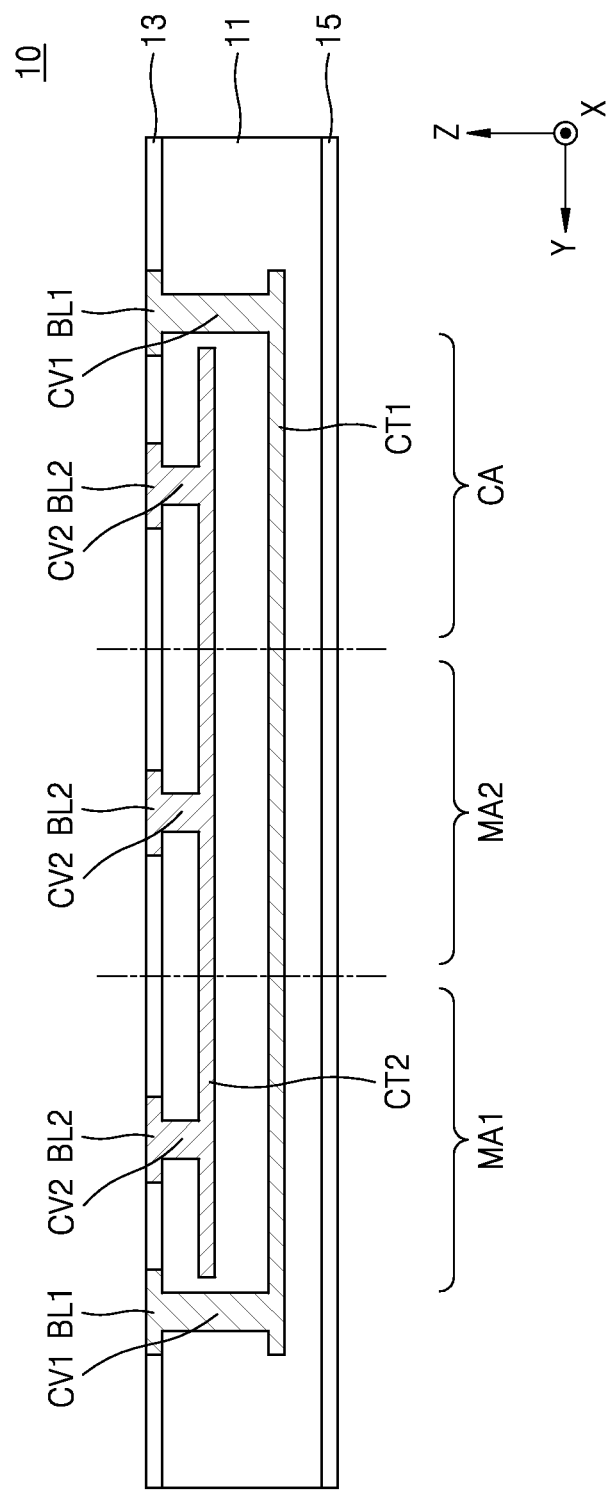

FIGS. 4A and 4B are a plan view and a cross-sectional view illustrating a PCB 10 according to some example embodiments, respectively.

Referring to FIGS. 4A and 4B, the PCB 10 is illustrated as including first through fourth channel patterns CHP1 through CH4 performing write and read operations.

The PCB 10 may include a body layer 11, a top protection layer 13, and a bottom protection layer 15. The PCB 10 may include wiring units, and the wiring units on the PCB 10 may be electrically connected to the first semiconductor package 120 through connection terminals. In addition, the PCB 10 may include the port 180. The PCB 10 may be electrically connected to a module substrate, a system board, a main board, etc. through the port 180, on which the PCB is mounted.

In the body layer 11, the wiring units of a multi-layer or a single layer may be formed, and through the wiring units, the PCB 10 may be electrically connected to the memory controller 140 and the first semiconductor package 120. The top and bottom protection layers 13 and 15 may perform a protection function and may be formed with solder resist.

In addition, the body layer 11 may be generally implemented by pressing to a certain thickness a high polymer material such as thermosetting resin, epoxy resin or phenolic resin such as flame retardant 4 (FR-4), bismaleimide triazine (BT), and Ajinomoto build-up film (ABF), forming the pressed result into a thin layer, coating copper foil on both sides of the formed thin layer, and forming through patterning the wiring units which are transmission paths of electrical signals.

In addition, the PCB 10 may be differentiated into a single layer PCB forming the wirings on one side thereof and a double layer PCB forming the wirings on both sides thereof. In addition, the number of thin layers may be 3 or more and may be formed by using an insulating material such as prepreg, and a PCB including multi-layer wirings may be implemented by forming 3 or more wiring layers according to the number of formed thin layers. However, inventive concepts are not limited to structures or materials of the PCB 10 described above.

The PCB 10 may be a substrate on which the semiconductor package is mounted thereon and include an insulating layer and the wiring unit. The wiring unit may include a first conductive trace CT1 and a second conductive trace CT2, which are formed in the insulating layer, and may include a first conductive via CV1 passing through the insulating layer and connected to the first conductive trace CT1, and a second conductive via CV2 passing through the insulating layer and connected to the second conductive trace CT2.

A first channel pattern CHP1 may be a first wiring unit and may include the first conductive trace CT1 extending in the Y direction, the first conductive via CV1 extending in the Z direction, and a first conductive pad BL1 formed on a top side of the first conductive via CV1.

A second channel pattern CHP2 may be a second wiring unit and may include the second conductive trace CT2 extending in the Y direction, the second conductive via CV2 extending in the Z direction, and a second conductive pad BL2 formed on a top side of the second conductive via CV2.

In some example embodiments according to inventive concepts, the reason why the second channel pattern CHP2 formed in a daisy chain manner/topology has different wiring lengths in a first mounting area MA1 and a second mounting area MA2 is because providing a method for compensating for signal loss in only any one of the first mounting area MA1 and the second mounting area MA2 may be desired.

On the other hand, when the second channel pattern CHP2 is formed to have the same wiring unit length in the first mounting area MA1 and the second mounting area MA2, providing a method for compensating for signal loss in both the first mounting area MA1 and the second mounting area MA2 is desired, and accordingly, economical efficiency may be reduced.

In some example embodiments according to inventive concepts, the first semiconductor package 120 in the first mounting area MA1 may be electrically connected to the first through fourth channel patterns CHP1 through CHP4, and the first semiconductor package 120 in the second mounting area MA2 may be electrically connected to the second and third channel patterns CHP2 and CHP3.

Although only the first and second channel patterns CHP1 and CHP2 are illustrated in FIG. 4B for convenience of description, the first and fourth channel patterns CHP1 and CHP4 may be configured to be substantially the same as each other in a point to point manner/topology (or may be configured as one channel pattern group), and the second and third channel patterns CHP2 and CHP3 may be configured to be substantially the same as each other in a daisy chain manner/topology (or may be configured as another channel pattern group). The second channel pattern CHP2 and the third channel pattern CHP3 may be formed to face each other and adjacent to each other, and the first channel pattern CHP1 and the fourth channel pattern CHP4 may be formed to face each other with the second channel pattern CHP2 and the third channel pattern CHP3 therebetween. Since the second and third channel patterns CHP2 and CHP3 are formed in a daisy chain manner/topology and have branching points in the middle thereof, the branching points may be configured in an arrangement shape as described above, so that the branching points do not overlap the first and fourth channel patterns CHP1 and CHP4, in other words, for easiness of circuit design. However, inventive concepts are not limited thereto.

In FIG. 4B, the first channel pattern CHP1 is illustrated as being formed on a layer closer to the bottom protection layer 15 than the second channel pattern CHP2. However, the second channel pattern CHP2 may be formed on a layer closer to the bottom protection layer 15 than the first channel pattern CHP1, and the first channel pattern CHP1 and the second channel pattern CHP2 may also be formed on the same layer.

The PCB 10 may include $2_N$ (N is an integer of 2 or more, or N is an integer of 2 or more and 10 or less) channel patterns connecting the first or second mounting areas MA1 or MA2 to a memory controller area. CA. Half of the $2_N$ channel patterns (that is, $2^{N-1}$) may be configured in a point to point manner/topology, and the other half of the $2_N$ channel patterns (that is, $2^{N-4}$) may be configured in the daisy chain manner/topology.

The PCB 10 may be configured to include the first and second mounting areas MA1 and MA2, which are two memory chip mounting areas, wherein a portion of the first and second mounting areas MA1 and MA2 includes all of the channel patterns while the other portion of the first and second mounting areas MA1 and MA2 includes only channel patterns configured in the daisy chain manner/topology. However, the number of memory chip mounting areas is not limited thereto.

The first and second mounting areas MA1 and MA2 may be arranged on the same side of the PCB 10, and the first mounting area MA1 may be arranged farther from the memory controller area CA than the second mounting area MA2. However, the arrangement of the first and second mounting areas MA1 and MA2 is not limited thereto.

In some example embodiments, when N=2, that is, when the PCB 10 includes four channel patterns, the PCB 10 may include the first and fourth channel patterns CHP1 and CHP4, which connect the first mounting area MA1 to the memory controller area CA in a point to point manner/topology. In addition, the PCB 10 may include the second and third channel patterns CHP2 and CHP3, which connect the first and second mounting areas MA1 and MA2 to the memory controller area CA in the daisy chain manner/topology.

For example, the memory controller area CA and the first mounting area MA1 may include all of the first and second conductive vias CV1 and CV2 and the first and second conductive pads BL1 and BL2, which are included in the first through fourth channel patterns CHP1 through CHP4, and the second mounting area MA2 may include only a portion of the first and second conductive vias CV1 and CV2 and the first and second conductive pads BL1 and BL2 which are included in the second and third channel patterns CHP2 and CHP3.

In addition, the PCB 10 may include a power supply area PA next to the memory controller area CA. However, an arrangement of the power supply area PA is not limited thereto.

A length in the X direction of the PCB 10, or 10X, may be specified as about 22 mm and a length in the Y direction of the PCB 10, or 10Y, may be specified as about 60 mm, about 80 mm, or about 110 mm. In other words, the PCB may be configured according to the M.2 standard, but inventive concepts are not limited thereto.

Figure 5A:
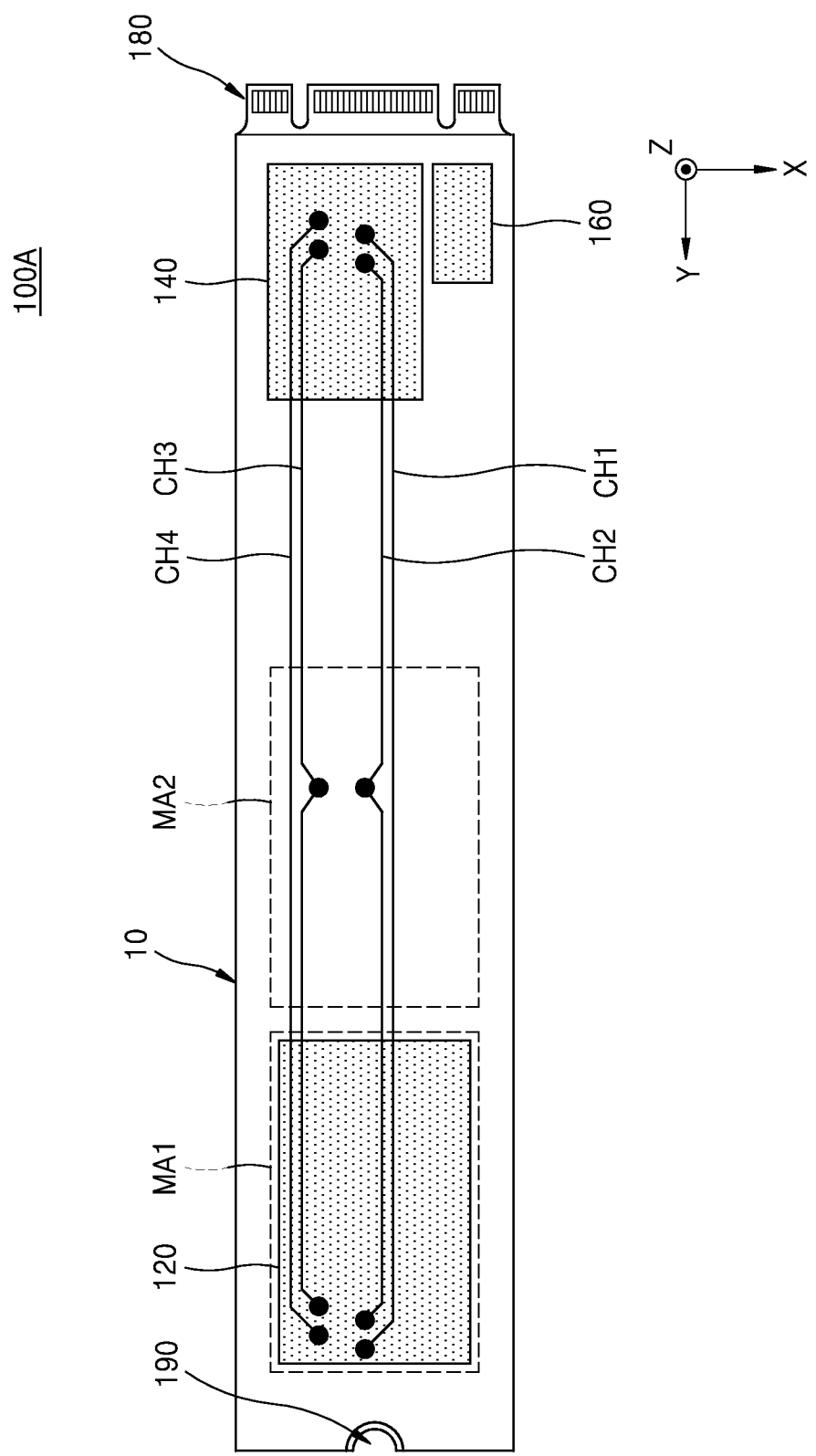
FIGS. 5A and 5B are a plan view and a cross-sectional view illustrating a memory system according to some example embodiments, respectively.
Figure 5B:
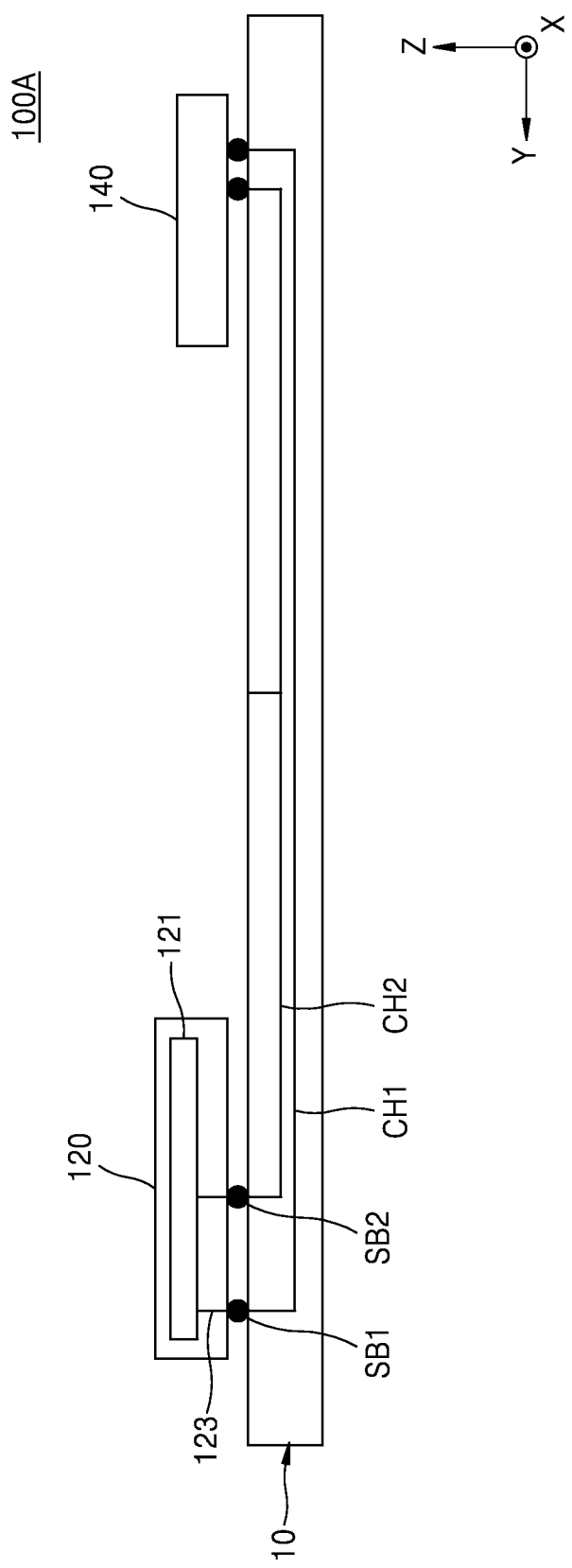

FIGS. 5A and 5B are a plan view and a cross-sectional view illustrating a memory system 100A according to some example embodiments, respectively.

Referring to FIGS. 5A and 5B, the first semiconductor package 120 may be mounted only in the first mounting area MA1 of the PCB 10, and the first through fourth channels CH1 through CH4 may denote the memory system 100A electrically connected to the first semiconductor package 120.

The memory system 100A may include the first semiconductor package 120 mounted in the first mounting area MA1 of the PCB 10. In addition, the memory system 100A may include the memory controller 140 and the power supply 160 on the same side of the first mounting area MA1.

The first semiconductor package 120, the memory controller 140, and the power supply 160 may include a plurality of patterns exposed to the outside, and the exposed patterns may be electrically connected to patterns formed on the PCB 10.

The first semiconductor package 120 may include an active surface and an inactive surface, and may be mounted above the PCB 10 through electrical connecting members such as a first connecting member SB1 and a second connecting member SB2.

The first semiconductor package 120 may include a first memory chip 121. The first memory chip 121 may be formed on a wafer as a basis. The wafer may include silicon (Si), for example, monocrystalline silicon, polycrystalline silicon, or amorphous silicon. However, the material of the wafer is not limited to Si. In some example embodiments, the wafer may include a Group IV semiconductor such as germanium (Ge), a Group IV-IV compound semiconductor such as silicon germanium (SiGe) and silicon carbide (SiC), or a Group III-V compound semiconductor such as gallium arsenide (GaAs), indium arsenide (InAs), and indium phosphide (InP).

The wafer may be based on a Si bulk substrate or a silicon on insulator (SOI) substrate. In some example embodiments, the wafer may not be limited to a silicon bulk substrate or an SOI substrate, but may be based on an epitaxial wafer, a polished wafer, an annealed wafer, etc.

A plurality of first and second connecting members SB1 and SB2 may be formed on the active surface of the first semiconductor package 120, and the first memory chip 121 may be connected to the plurality of first and second connecting members SB1 and SB2 through a first internal wiring 123, and the plurality of first and second connecting members SB1 and SB2 may be electrically connected to the PCB 10.

The first and second connecting members SB1 and SB2 may electrically connect to the PCB 10 components included in the memory system 100A such as the first semiconductor package 120, the memory controller 140, and the power supply 160. Accordingly, since the first semiconductor package 120 is not mounted in the second mounting area MA2, the first and second connecting members SB1 and SB2 may not be formed in the second mounting area MA2.

The first and second connecting members SB1 and SB2 may correspond to conductive materials used for tap automated bonding (TAB) or flip chip bonding of the first semiconductor package 120 onto the PCB 10. The first and second connecting members SB1 and SB2 may also be used as conductive materials for directly connecting a ball grid array (BGA) to the PCB 10. The first and second connecting members SB1 and SB2 may be or include, for example, solder balls or solder bumps.

The memory controller 140 may receive the request REQ from the host 200. through the port 180 and transmit the response RES to the host 200 through the port 180. For example, the memory controller 140 may receive the request REQ for reading data from the host 200 through the port 180, and in response to the received request REQ, the memory controller 140 may read data stored in the first memory chip 121 included in the first semiconductor package 120 and transmit the read data to the host 200 through the port 180.

The power supply 160 may receive the power PWR from the host 200 through the port 180 and may provide the power PWR to components included in the memory system 100A such as the first semiconductor package 120 and the memory controller 140 based on the received power PWR.

The memory system 100A may specify the port 180. The port 180 may be arranged on one side of the PCB 10 and may include the plurality of pins for communicating with the host 200. In addition, the indented structure 190 for mounting and fixing the memory system 100A to the host 200 may be formed on the PCB 10. The PCB 10 may include the semicircular indented structure 190 formed on a side opposite the port 180.

The memory system 100A may include one first semiconductor package 120 arranged in the first mounting area MA1 of the PCB 10 and including the first memory chip 121, and the memory controller 140 connected to the $2^N$ (N is an integer of 2 or more, or N is an integer of 2 or more and 10 or less) channels for performing write and read operations on the first semiconductor package 120. Here, the case in which N=2 is described as an example.

In the embodiments according to inventive concepts, the first semiconductor package 120 may be connected to the first through fourth channels CH1 through CH4 in the first mounting area MA1. Although only the first and second channel patterns CHP1 and CHP2 are illustrated in FIG. 5B for convenience of description, the first and fourth channel patterns CHP1 and CHP4 may be operated substantially in the same manner (or may be configured as one channel pattern group), and the second and third channel patterns CHP2 and CHP3 may be operated substantially in the same manner (or may be configured as another channel pattern group)

The second channel pattern CHP2 and the third channel pattern CHP3 may be formed to face each other while being adjacent to each other, and the first channel pattern CHP1 and the fourth channel pattern CHP4 may be formed to face each other with the second channel pattern CHP2 and the third channel pattern CHP3 therebetween. However, inventive concepts are not limited thereto.

In the memory system 100A, the first semiconductor package 120 may be mounted only in the first mounting area MA1, and all of the first through fourth channels CH1 through CH4 may be electrically connected to the first semiconductor package 120. Accordingly, an end of the second channel CH2 and an end of the third channel CH3 may be exposed to the outside in the second mounting area MA2, where the first semiconductor package 120 is not mounted.

Figure 6A:
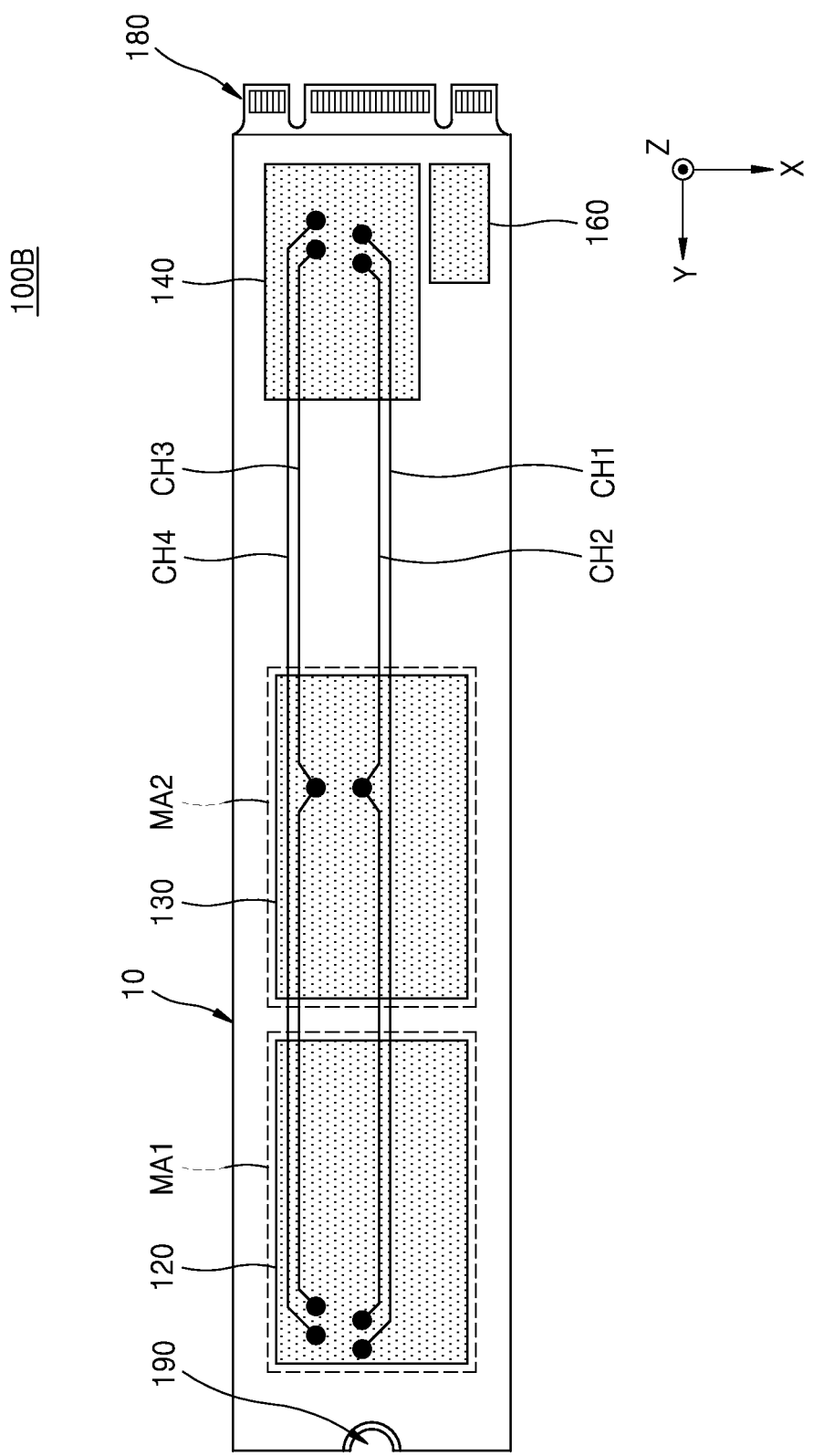
FIGS. 6A and 6B are a plan view and a cross-sectional view illustrating a memory system according to some example embodiments, respectively.
Figure 6B:
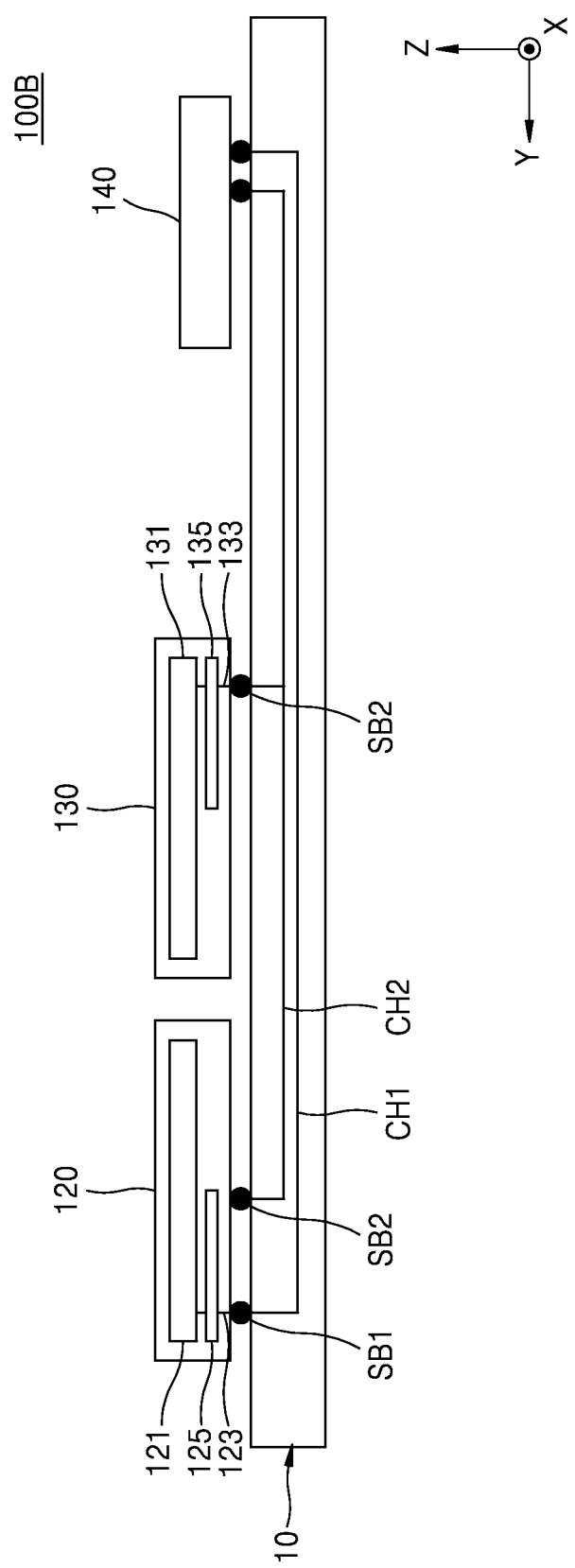

As described above, by mounting the first semiconductor package 120 only in the first mounting area MA1, the memory system 100A, which requires a memory capacity that is relatively lower than that of a memory system 100B of FIGS. 6A and 6B, may be implemented. In other words, in the PCB 10 having one form factor, the memory system 100A having a relatively low capacity may be implemented by using only a portion of the first and second mounting areas MA1 and MA2.

FIGS. 6A and 6B are a plan view and a cross-sectional view illustrating a memory system 100B according to some example embodiments, respectively.

Referring to FIGS. 6A and 6B, the memory system 100B is illustrated in which the first semiconductor package 120 is mounted in the first mounting area MA1 of the PCB 10, a second semiconductor package 130 is mounted in the second mounting area MA2, the first and fourth channels CH1 and CH4 are electrically connected to the first semiconductor package 120, and the second and third channels CH2 and CH3 are electrically connected to the second semiconductor package 130.

Each of the components included in the memory system 100B and electrical connection relationships between the components may be the same as or similar to those described above with reference to FIGS. 5A and 5B, and thus, differences are mainly described hereinafter.

The second and third channels CH2 and CH3 in the first mounting area MA1 may be in a floating state. The first semiconductor package 120 mounted on the first mounting area MA1 and the second semiconductor package 130 mounted on the second mounting area MA2 may have the same data storage capacity. In other words, the first and second semiconductor packages 120 and 130 may include the first memory chip 121 and a second memory chip 131 having the same storage capacity, respectively. In this case, since the same data processing capability is required, the second and third channels CH2 and CH3 of the first semiconductor package 120 may be configured as being physically attached to the first semiconductor package 120 through the first and second connecting members SB1 and SB2, but may be configured as not being electrically connected to the first semiconductor package 120.

The first semiconductor package 120 may include the first internal wiring 123. In this case, when the first internal wiring 123 and the second and third channels CH2 and CH3 are not electrically connected to each other, the second and third channels CH2 and CH3 may be in a floating state. Accordingly, the first and second semiconductor packages 120 and 130 may communicate with the memory controller 140 by using the same number of channels (that is, two).

The first semiconductor package 120 mounted in the first mounting area MA1 and the second semiconductor package 130 mounted in the second mounting area MA2 may be memory systems 100B including a first buffer chip 125 and a second buffer chip 135, respectively.

The first and second buffer chips 125 and 135 may be connected to the first and second memory chips 121 and 131 through the first internal wiring 123 and a second internal wiring 133, respectively. The first and second buffer chips 125 and 135 may operate as a sense amplifier in the read operation and output data stored in the first and second memory chips 121 and 131. On the other hand, in a program operation, the first and second buffer chips 125 and 135 may operate as a write driver and input data to be stored in the first and second memory chips 121 and 131.

For example, since the first and second semiconductor packages 120 and 130 include the first and second buffer chips 125 and 135, respectively, even when the write and read operations are electrically connected to some of the channels (that is, two channels, respectively), the write and read operations may be performed similarly to the case where the write and read operations are electrically connected to all of the channels (that is, four, respectively).

As described above, the memory system 100B, which requires a relatively high memory capacity as compared with the memory system 100A previously described with reference to FIGS. 5A and 5B, may be implemented by mounting the first semiconductor package 120 in the first mounting area MA1 and mounting the second semiconductor package 130 in the second mounting area MA2. In other words, the memory system 100B may be implemented having the relatively high memory capacity by using both the first and second mounting areas MA1 and MA2 in the PCB 10 having one form factor.

Figure 7B:
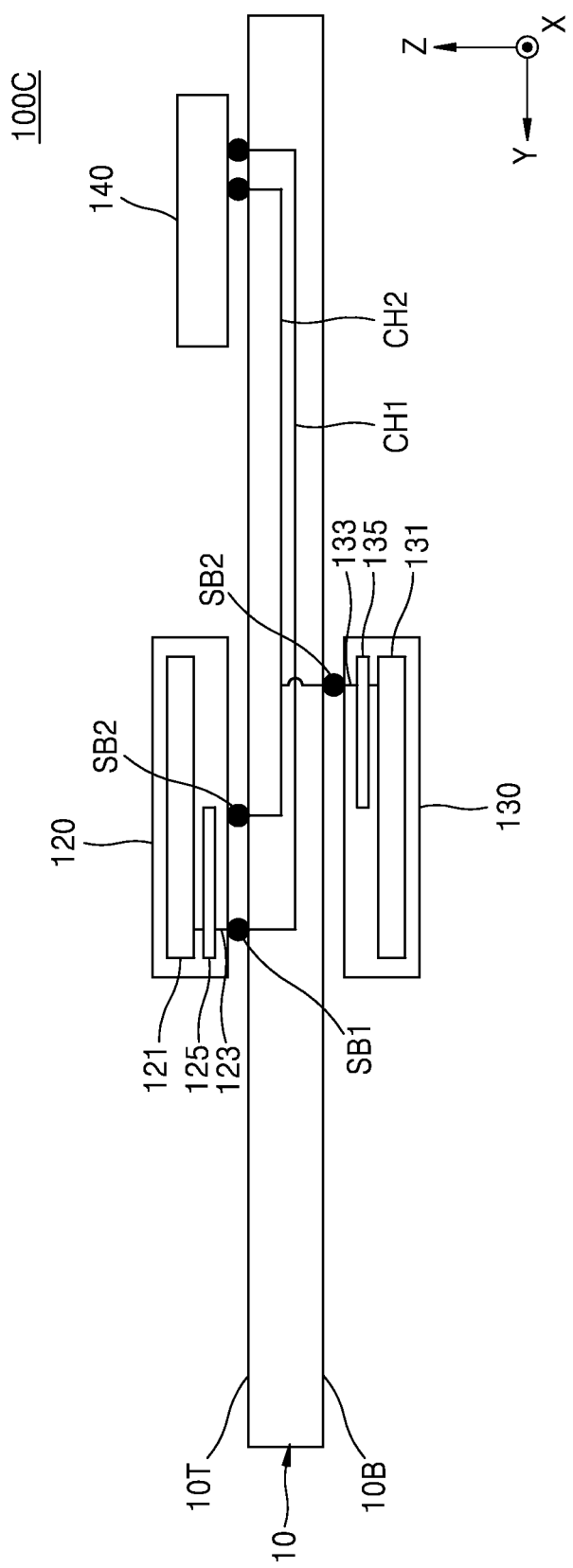

FIGS. 7A and 7B are a plan view and a cross-sectional view illustrating a memory system 100C according to some example embodiments, respectively.

Referring to FIGS. 7A and 7B, the memory system 100C is illustrated in which the first semiconductor package 120 is mounted in the first mounting area MA1 of a top surface 10T of the PCB 10, the second semiconductor package 130 is mounted in the second mounting area MA2 of a bottom surface 10B of the PCB 10, the first and fourth channels CH1 and CH4 are electrically connected to the first semiconductor package 120, and the second and third channels CH2 and CH4 are electrically connected to the second semiconductor package 130.

Each of the components included in the memory system 100C and electrical connection relationships between the components may be the same as or similar to those described above with reference to FIGS. 5A and 5B, and thus, differences are mainly described hereinafter.

The PCB 10 may be or include a double-sided PCB including the wirings on both the top and bottom surfaces 10T and 10B. Accordingly, the PCB 10 may include the mounting areas, facing each other, on both the top surface 10T and the bottom surface 10B, respectively, and the first and second semiconductor packages 120 and 130 may be mounted, facing each other, on the PCB 10. In this case, the conductive vias included in the second and third channels CH2 and CH3 may be formed in such a manner that the conductive vias toward the first mounting area MA1 and the conductive vias toward the second mounting area MA2 are formed in directions opposite to each other.

The second and third channels CH2 and CH3 of the first mounting area MA1 may be in a floating state. In addition, the first semiconductor package 120 mounted in the first mounting area MA1 and the second semiconductor package 130 mounted in the second mounting area MA2 may be the memory systems 100C including the first and second buffer chips 125 and 135, respectively. Descriptions thereof are substantially the same as those described with reference to FIGS. 6A and 6B, and thus are omitted here.

As described above, the memory system 100C, which requires a relatively high memory capacity as compared with the memory system 100A previously described with reference to FIGS. 5A and 5B, may be implemented by mounting the first semiconductor package 120 in the first mounting area MA1 and mounting the second semiconductor package 130 in the second mounting area MA2. In other words, the memory system 100C may be implemented having the relatively high memory capacity by using both the first and second mounting areas MA1 and MA2 in the PCB 10 having one form factor.

Figure 8:
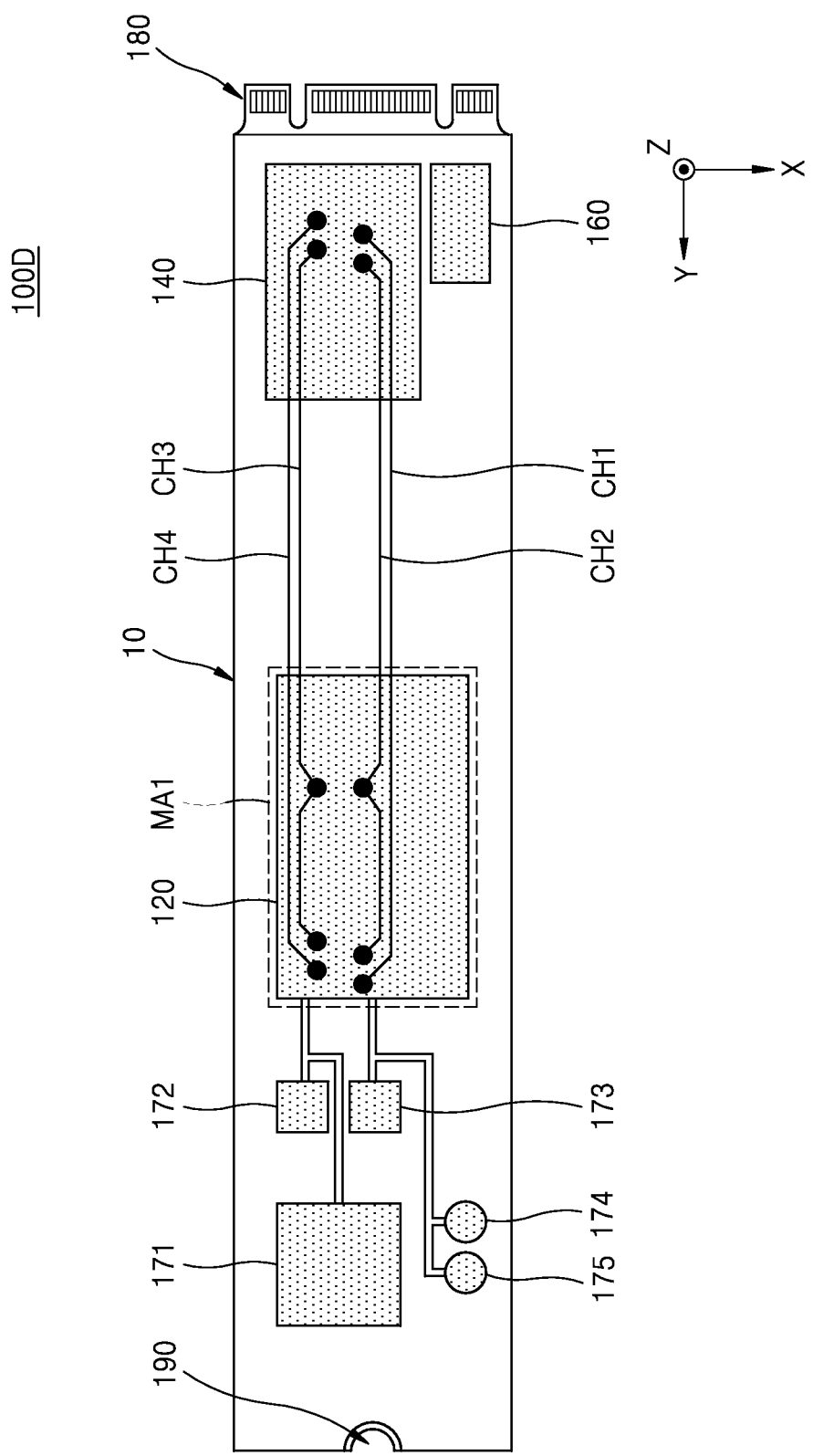
FIG. 8 is a plan view illustrating a memory system according to some example embodiments.

FIG. 8 is a plan view of a memory system 100D according to some example embodiments.

Referring to FIG. 8, the memory system 100D may include at least one component for sudden power off recovery (SPOR) attached to the PCB 10.

Each of the components included in the memory system 100D and electrical connection relationships between the components may be the same as or similar to those described above with reference to FIGS. 5A and 5B, and thus, differences are mainly described hereinafter.

When the power PWR supplied to the memory system 100D is suddenly interrupted, the SPOR may terminate operations performed in the memory system 100D in a normal manner by supplying the power PWR to the memory system 100D for a certain time period, and thus, prevent or reduce the likelihood of an occurrence of an error in the memory system 100D. Components for the SPOR, for example, a capacitor and a battery having high capacitance, may be used.

The memory system 100D may include components for the SPOR (171 through 175) attached to the PCB 10 to enable a stable operation of the memory system 100D. In some example embodiments, when the memory system 100D is used in a stationary electronic device such as a server, the stable operation of the memory system 100D may be required. In some example embodiments, when the memory system 100D is used in a mobile electronic device such as a notebook computer, the size of the memory system 100D may require a particular consideration. Thus, the memory system 100D according to inventive concepts may satisfy all conditions required by respective applications described above.

The components for the SPOR (171 through 175) may not affect normal operations of the first semiconductor package 120, the memory controller 140, and the power supply 160 which are attached to the PCB 10, and in other words, may not affect the normal operations thereof while the power PWR is supplied from the host 200.

Although the components for the SPOR (171 through 175) are illustrated as being attached to the same side of the PCB 10 like the semiconductor package 120, the memory controller 140, and the power supply 160, components for additional SPOR may be attached to the opposite side of the PCB 10.

Figure 9:
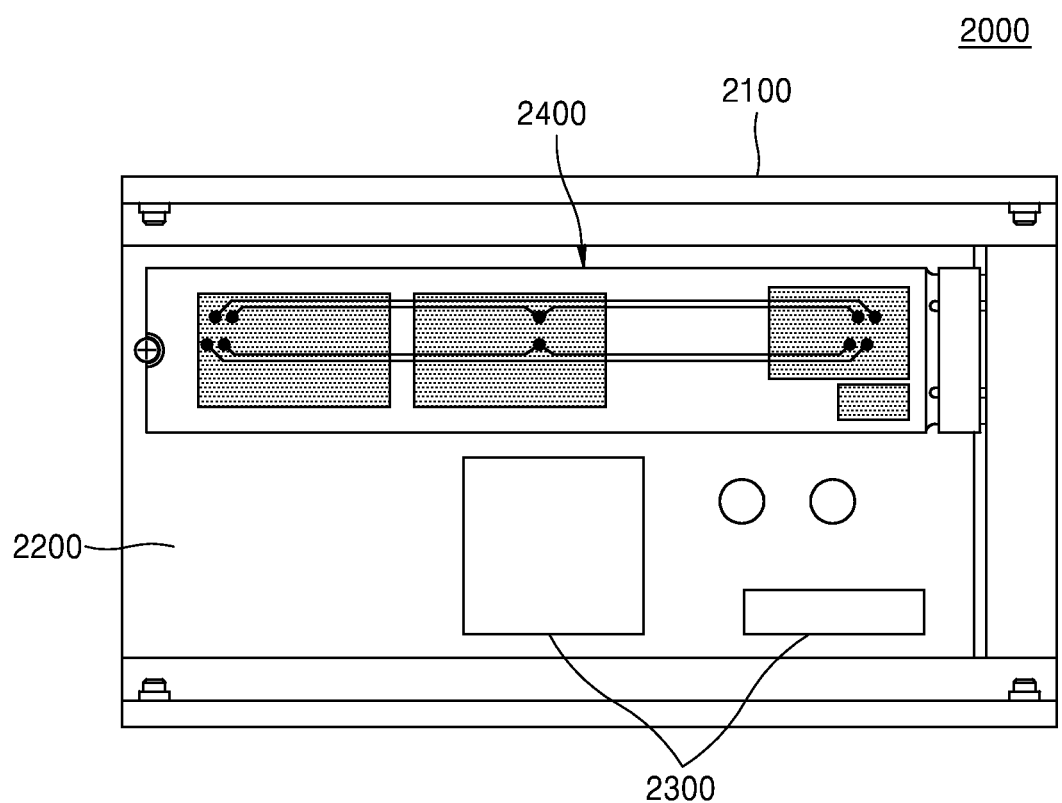
FIG. 9 is a plan view illustrating a host including a storage device according to some example embodiments.

FIG. 9 is a plan view illustrating a host 2000 including a storage device 2400 according to some example embodiments.

The host 2000 may include a main board 2200 arranged inside a housing 2100, and the main board 2200 may include a storage device 2400 and an electrical element, for example, a passive element 2300 such as a capacitor, an inductor, and/or a resistor in a peripheral area surrounding the storage device 2400.

The host 2000 may require the passive element 2300 for smooth signal delivery to the storage device 2400. The resistor may reduce noise of a signal wave, and the capacitor may act as a decoupling capacitor.

A computer bus interface provided to the host 2000 may be similar to that to be described later with reference to FIG. 10. A selection of which interface to support according to a support level of the host 2000 or a type of an apparatus may depend on the corresponding host 2000 and apparatus.

Figure 10:
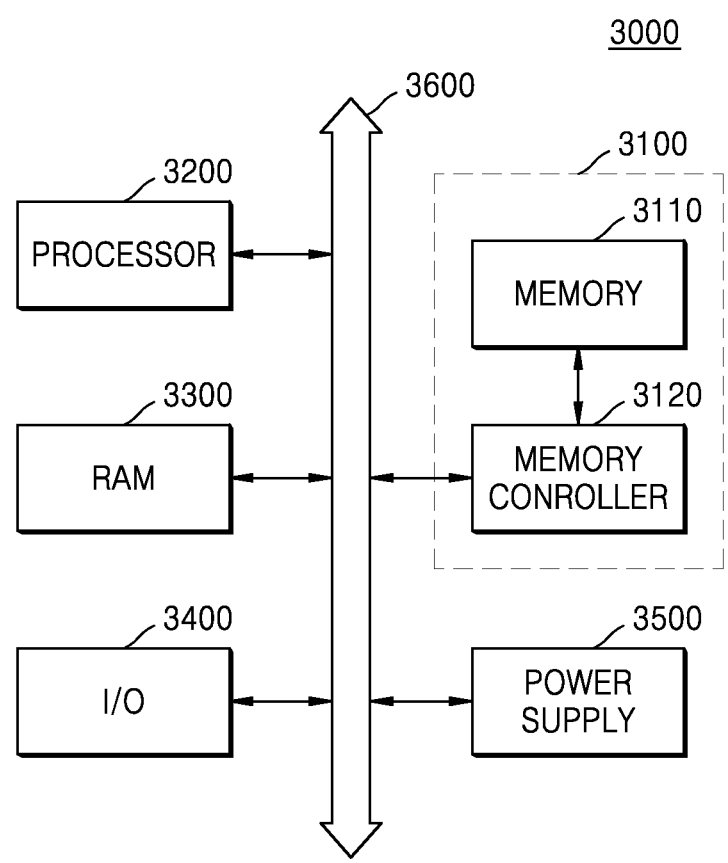
FIG. 10 is a block diagram of a computing system including a memory system according to some example embodiments.

FIG. 10 is a block diagram of a computing system 3000 including a memory system 3100 according to some example embodiments.

Referring to FIG. 10, the computing system 3000 may include the memory system 3100, a processor 3200, RAM 3300, an input/output (I/O) device 3400, and a power supply 3500. Although not illustrated, the computing system 3000 may further include a port for communicating with a video card, a sound card, a memory card, a USB device, or the like, or with other electronic devices. The computing system 3000 may be implemented as a stationary electronic device such as a personal computer and a server, or a mobile electronic device such as a cellular phone, a digital camera, a personal digital assistant (PDA), and a notebook computer.

The processor 3200 may perform certain calculations or tasks. In some example embodiments, the processor 3200 may be a microprocessor or a central processing unit (CPU). The processor 3200 may perform communication with the RAM 3300, the I/O device 3400, and the memory system 3100 through a bus 3600 such as an address bus, a control bus, and a data bus. The processor 3200 may also be connected to an expansion bus such as a PCI bus.

The memory system 3100 may be implemented by using any one of the memory systems 100A, 100B, 100C, and 100D described with reference to FIGS. 4A through 8, and may be re-configured to have the memory capacity required by the computing system 3000.

The RAM 3300 may store data required for operations of the computing system 3000. For example, the RAM 3300 may be implemented with DRAM, mobile DRAM, SRAM, PRAM, FRAM, RRAM, and/or MRAM.

The I/O device 3400 may include input tools such as a keyboard, a keypad, a mouse, and a touch pad, and output tools such as a printer, a display, and a touch screen.

The power supply 3500 may provide an operating power required for operations of the computing system 3000.

Although inventive concepts have been described with reference to attached drawings, it should be appreciated by those of ordinary skill in the art that inventive concepts may be implemented in other particular applications without changing the technical aspect or characteristics thereof. Therefore, the embodiments described above should be understood as exemplary in all aspects and non-limiting.

What is claimed is:

1. A memory system comprising:
   a printed circuit board;
   at least one memory chip mounted on the printed circuit board; and
   a memory controller arranged on the printed circuit board and connected to $2^N$ (where N is an integer of 2 or more) channels, the memory controller configured to perform a write operation and a read operation on the at least one memory chip,
   wherein, a first subset of the channels corresponds to a first channel group arranged in the printed circuit board in a point to point topology, and a remaining subset of the channels corresponds to a second channel group arranged in the printed circuit board in a daisy chain topology,
   wherein the channels include a first channel pattern, a second channel pattern, a third channel pattern, and a fourth channel pattern,
   the first subset of the channels that is arranged in a point-to point topology includes the first channel pattern and the fourth channel pattern, and
   the remaining subset of the channels that is arranged in a daisy chain topology includes the second channel pattern and the third channel pattern, each of the second channel pattern and the third channel pattern including a branching point in a middle of the printed circuit board, the branching point not overlapping the first and fourth channel patterns.

2. The memory system of claim 1, wherein the printed circuit board comprises, a first mounting area connected to the first channel group arranged in the point to point topology and the second channel group arranged in the daisy chain topology, and a second mounting area connected to the second channel group arranged in the daisy chain topology.

3. The memory system of claim 2, wherein the first and second mounting areas are respectively on different sides of the printed circuit board.

4. The memory system of claim 2, wherein the at least one memory chip is mounted in the first mounting area, and the first and second channel groups are electrically connected to the at least one memory chip.

5. The memory system of claim 1, wherein the channels of the first channel group are arranged apart from each other with the second channel group therebetween.

6. The memory system of claim 2, wherein,
the memory chips are mounted in all of the first and second mounting areas,
the first channel group is connected to the memory chip of the first mounting area, and
the second channel group is connected to the memory chip of the second mounting area.

7. The memory system of claim 6, wherein the memory chips mounted in the first and second mounting areas comprise buffer chips.

8. The memory system of claim 6, wherein the second channel group of the first mounting area is in a floating state.

9. The memory system of claim 6, wherein a data storage capacity of each of the memory chips mounted in the first and second mounting areas is the same.

10. A printed circuit board comprising:
a set of channels including a first wiring unit inside a substrate wired in a point to point topology and a second wiring unit inside the substrate wired in a daisy chain topology;
a memory controller area on a surface of the substrate;
a first memory chip mounting area arranged on the surface of the substrate; and
a second memory chip mounting area arranged on the surface of the substrate,
wherein the first memory chip mounting area includes all of the first and second wiring units extending from the memory controller area, and the second memory chip mounting area includes the second wiring unit extending from the memory controller area,
wherein the set of channels include a first channel pattern, a second channel pattern, a third channel pattern, and a fourth channel pattern,
the first wiring unit that is arranged in a point-to point topology includes the first channel pattern and the fourth channel pattern, and
the second wiring unit that is arranged in a daisy chain topology includes the second channel pattern and the third channel pattern, each of the second channel pattern and the third channel pattern including a branching point in a middle of the printed circuit board, the branching point not overlapping the first and fourth channel patterns.

11. The printed circuit board of claim 10, wherein the first and second mounting areas are on respectively different sides of the printed circuit board.

12. The printed circuit board of claim 10, wherein both the first and second mounting areas are on one side of the printed circuit board, and the first mounting area is arranged farther away from the memory controller area than the second mounting area.

13. The printed circuit board of claim 10, wherein the first mounting area comprises a plurality of conductive pads electrically connected to each of the first and second wiring units, and the second mounting area comprises one of the plurality of conductive pads electrically connected to the second wiring unit.

14. The printed circuit board of claim 10, wherein a number of first wiring units is the same as a number of second wiring units, and a sum of the numbers of first and second wiring units is 2N (where N is an integer of 2 or more).

15. A storage device comprising:
a printed circuit board;
at least one semiconductor package mounted on the printed circuit board and including a plurality of non-volatile memory chips; and
a memory controller arranged on the printed circuit board and connected to $2^N$ (where N is an integer of 2 or more) channels, the memory controller configured to perform write and read operations on the at least one semiconductor package,
wherein the printed circuit board comprises,
an insulating layer,
a first wiring unit and a second wiring unit, the first wiring unit and the second wiring unit comprising conductive traces formed on the insulating layer, and conductive vias configured to pass through the insulating layer and connected to the conductive traces,
wherein a first half of the channels is configured as a first wiring unit that is wired in a point to point topology, and a remaining, second half of the channels is configured as a second wiring unit that is wired in a daisy chain topology,
wherein the channels include a first channel pattern, a second channel pattern, a third channel pattern, and a fourth channel pattern,
the first half of the channels that is arranged in a point-to point topology includes the first channel pattern and the fourth channel pattern, and
the remaining half of the channels that is arranged in a daisy chain topology includes the second channel pattern and the third channel pattern, each of the second channel pattern and the third channel pattern including a branching point in a middle of the printed circuit board, the branching point not overlapping the first and fourth channel patterns.

16. The storage device of claim 15, wherein
the printed circuit board comprises a first semiconductor package mounting area and a second semiconductor package mounting area,
the first mounting area includes both the first and second wiring units, and second includes the second wiring unit.

17. The storage device of claim 15, wherein the conductive vias included in the second wiring unit comprise:
first conductive vias exposed to one side of the printed circuit board; and
second conductive vias exposed to another side of the printed circuit board.

18. The storage device of claim 16, wherein the conductive vias included in all of the first and second wiring units are included in the first mounting area, and the conductive vias included in the second wiring unit are included in the second mounting area.

19. The storage device of claim 15, wherein each of the nonvolatile memory chips comprises a NAND flash memory, and the storage device comprises a solid state drive (SSD).

* * * * *